United States Patent [19]
Hoinkis

[11] Patent Number: 5,989,633
[45] Date of Patent: Nov. 23, 1999

[54] PROCESS FOR OVERCOMING CVD ALUMINUM SELECTIVITY LOSS WITH WARM PVD ALUMINUM

[75] Inventor: Mark Hoinkis, San Jose, Calif.

[73] Assignee: Applied Materials, Inc., Santa Clara, Calif.

[21] Appl. No.: 08/638,762

[22] Filed: Apr. 29, 1996

[51] Int. Cl.⁶ .................................................. C23C 16/06
[52] U.S. Cl. .................... 427/250; 427/255.2; 427/255.7; 204/192.1; 204/192.17; 438/658
[58] Field of Search .............................. 427/99, 124, 250, 427/255.2, 255.7; 204/192.1, 192.17; 438/658

[56] References Cited

U.S. PATENT DOCUMENTS

| | | | |
|---|---|---|---|
| 5,100,501 | 3/1992 | Blumenthal et al. | 156/643 |
| 5,151,305 | 9/1992 | Matsumoto et al. | 427/252 |
| 5,169,803 | 12/1992 | Miyakawa | 438/658 |
| 5,171,412 | 12/1992 | Talieh et al. | 204/192.15 |
| 5,514,425 | 5/1996 | Ito et al. | 427/534 |

FOREIGN PATENT DOCUMENTS

| | | |
|---|---|---|
| 6-10693 | 1/1986 | Japan . |
| 2513900 | 4/1996 | Japan . |

*Primary Examiner*—Shrive Beck
*Assistant Examiner*—Timothy Meeks
*Attorney, Agent, or Firm*—Patterson & Streets, L.L.P.

[57] ABSTRACT

The present invention provides a process for depositing a planarized metal film on a dielectric surface having nonuniform conductor material deposits formed thereon. The planarized metal layer is formed using a warm physical vapor deposition process at a temperature greater than about 150° C., preferably greater than about 250° C. The nonuniform deposits of electrically conducting material are typically formed during selective chemical vapor deposition of a metal in high aspect ratio, subhalf micron apertures. The selective CVD deposition is directly followed by warm physical vapor deposition to obtain a planarized metal film. The metallization process is preferably carried out in an integrated processing system that includes both a PVD and CVD processing chamber so that once the substrate is introduced into a vacuum environment, the metallization of the apertures to form interconnects occurs without the formation of oxides between the layers.

15 Claims, 6 Drawing Sheets

PROCESS FOR OVERCOMING CVD ALUMINUM SELECTIVITY LOSS WITH WARM PVD ALUMINUM

BACKGROUND OF THE INVENTION

1. Field of the Invention

The present invention relates to a metallization method and apparatus for manufacturing semiconductor devices. More particularly, the present invention relates to a process for depositing a planarized metal film on a dielectric surface having nonuniform conductor material deposits formed thereon by using a warm physical vapor deposited metal. Even more particularly, the present invention relates to the selective metallization of apertures in insulative layers to form void-free interconnects between conducting layers, including apertures such as contacts or vias in high aspect ratio, i.e., sub-half micron wide aperture applications, and subsequent deposition of planar blanket films over surfaces suffering from loss of selectivity.

2. Background of the Related Art

Sub-half micron multilevel metallization is one of the key technologies for the next generation of very large scale integration ("VLSI"). The multilevel interconnect that lie at the heart of this technology require planarization of interconnect features formed in high aspect ratio apertures, including contacts, vias, lines or other features. High aspect ratios are features having a depth/width ratio of one or greater, typically of a depth of $1.2\mu$. Reliable formation of these interconnect features is very important to the success of VLSI and to the continued effort to increase circuit density and quality on individual substrates and die.

Two conventional methods for depositing conducting film layers on substrates are chemical vapor deposition (CVD) and physical vapor deposition (PVD). Typically CVD provides better step coverage in very small aperture geometries, i.e., the deposition thickness at the base of the aperture is close to that on the adjacent field, while PVD provides desirable crystal structure and desirable orientation of the deposited film. Until recently, CVD and PVD processes were performed on different system platforms which required that the substrates first undergo one processing method and subsequently moved with an air break into a second platform for processing with another method. Transfer of the substrates from one platform to another decreases throughput of a substrate to complete device fabrication thereon, and exposes the most uppermost deposited surfaces to the atmosphere, typically forming an oxide layer. Therefore, it has not been considered effective to use the two processes to take advantage of the strengths of each process, i.e., good step coverage and good crystal orientation and reflectivity.

Two conventional methods for depositing conducting material by chemical vapor deposition ("CVD") include a blanket process and a selective process. CVD processes typically involve the deposition of a film layer which occurs when a component of the chemical vapor contacts a "nucleation site" on the substrate. The component attaches to the nucleation site, creating a deposit surface on which further deposition proceeds, i.e. grows laterally and vertically. A blanket CVD process typically deposits a film on the entire exposed surface of the substrate, including the sidewall and bottom of apertures, as well as the field, i.e., the uppermost exposed surface of the substrate, because surface exposed to the vapor serve as nucleation sites for deposition.

Selective CVD deposition is based on the fact that the decomposition of the CVD precursor gas to provide a deposition film usually requires a source of electrons from a conductive nucleation film. In accordance with a conventional selective CVD deposition process, the conducting film should grow in the bottom of an aperture where either a metal film, or doped silicon from the underlying conductive layer are exposed, but should not grow on the dielectric surface of the field and aperture walls. The underlying metal films and doped silicon are both conductive and supply the electrons needed for decomposition of the precursor gas and resulting deposition of the conducting film. The insulative film in its best form does not have free electron sites. Once deposition is initiated, the deposited metal is an electron donor. The result obtained through selective deposition is a "bottom-up" growth of a CVD conducting film in the holes, thereby enabling filling very small dimension (<0.25 $\mu$m), high aspect ratio (>5:1) via or contact openings. Although in theory a selective CVD process should be capable of providing a defect free fill of an aperture on every occasion, in reality this is not the case.

Referring to FIG. 1, a drawing prepared from data obtained with a scanning electron microscope shows a top angle view of a patterned wafer which has been precleaned (sputtered with Ar for 60 seconds) and subsequently deposited with a selective CVD Al process. In actual practice of selective deposition processes, there are almost always defects on the surface of the dielectric and on the sidewalls of the apertures which provide free electrons and thus also serve as nucleation sites for CVD Al growth, causing unwanted deposition of conducting material in the form of nodules on the dielectric surface or field. The SEM shows the upper surface of the selectively deposited metal interconnects as well as nodules formed on defects in the dielectric layer surrounding the interconnects.

Referring to FIGS. 2 and 3, a top angle view and cross-sectional view of a patterned wafer are shown wherein approximately 6000 Angstroms of PVD Al at 150° C. have been deposited over the CVD layer. The rough surface of the metal film of FIG. 2 is caused by the nodules shown in FIG. 1 even after deposition of a thick PVD metal layer. Such a rough surface interferes with subsequent photolithographic processing of the wafer. Additionally, FIG. 3 shows several grain boundaries between crystals having various orientations dictated by various nodules. These grain boundaries may cause failure of the integrated circuit.

Various methods have been used to minimize or eliminate the loss of selectivity that leads to nodule formation, especially in selective tungsten (W) technology. These methods have included, for example, changing the type of dielectric material, preconditioning the substrate surface prior to selective deposition, and post deposition chemical mechanical polishing (CMP) of the surface to remove any nodules which form on the substrate surface during selective deposition. While some of these methods have been able to reduce the extent of nodule formation, selectivity loss almost always occurs in selective CVD deposition processes. Furthermore, these methods complicate the processing steps required to form the desired circuit structure and significantly increase the expense of the integrated circuit manufacturing process. Some processes, such as CMP, cannot reach the sidewalls of the apertures, and thus any nodules formed in that location will remain. In addition, adding steps to the overall process increases the likelihood that defects may result in the formed structures due to handling and/or contamination mishaps.

Therefore, there exists a need for a metallization process for void-free filling of apertures, particularly high aspect ratio, sub-quarter micron wide apertures for forming interconnects and planarization of a subsequent conducting layer. More particularly, it would be desirable to have a simple process that takes advantage of the selectivity and good coverage of CVD processes and good planarization, crystal structure and reflectivity of PVD processes, while overcoming the loss of selectivity on the field encountered in CVD processes and perceived geometric limitations on PVD.

SUMMARY OF THE INVENTION

The present invention provides a method of forming a planarized blanket metal film, comprising the step of physical vapor depositing a metal layer at a temperature greater than about 150° C. over a substrate field having nonuniform metal deposits previously formed thereon. The planarized metal layer is formed by warm physical vapor deposition process at a temperature greater than about 150° C., preferably greater than about 250° C. The nonuniform deposits of electrically conducting material are typically formed during selective chemical vapor deposition of a metal in high aspect ratio, sub-half micron apertures. The selective CVD deposition is directly followed by the physical vapor deposition to obtain a planarized metal film. The metallization process is preferably carried out in an integrated processing system that includes both a PVD and CVD processing chamber so that once the substrate is introduced into a vacuum environment, the metallization of the apertures to form interconnects occurs without the exposure of the substrate to atmosphere.

The present invention also provides a method of forming a void-free metal interconnect in a substrate aperture and a planarized metal film over the substrate field, the method comprising the steps of: selectively chemical vapor depositing a metal within the substrate apertures, wherein nonuniform deposits of the metal are formed on the substrate field due to a loss of selectivity; and physical vapor depositing a metal over the substrate field to provide a metal film having a substantially planar surface, wherein the wafer temperature during physical vapor depositions is greater than about 150° C.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefor not to be considered limiting of its scope, for the invention may admit to other equally effective embodiments.

DETAILED DESCRIPTION OF A PREFERRED EMBODIMENT

The present invention provides a simple process and apparatus for the selective deposition of material within small geometries, such as small apertures, such as vias and contacts, which overcomes the problems encountered with loss of selectivity on the field. This process comprises the steps of (1) depositing CVD metal over a field having small geometry apertures formed therein to provide selective growth of the metal within the apertures, and (2) depositing by PVD a metal thereover to provide a planarized metal film and minimize the effects of selectivity loss. Accordingly, the present invention provides a method for void-free filling of small geometries with a reduced number of processing steps and the formation of a planarized metal film on the field.

Figure 4:
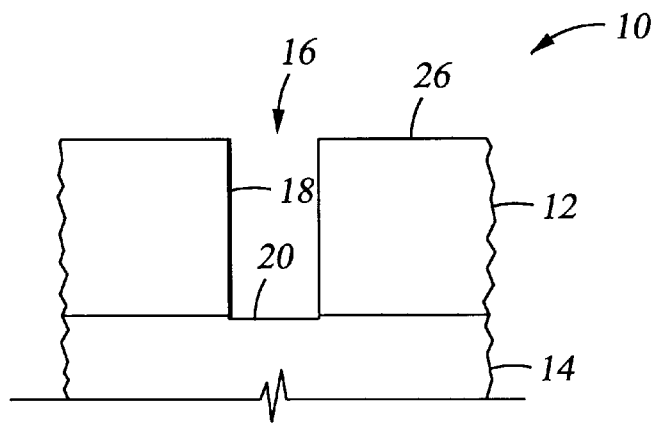
FIG. 4 is a cross-sectional view of an aperture etched into a dielectric layer having an underlying electrically conducting member.

Referring to FIG. 4, a cross-sectional diagram of a layered structure 10 is shown including a dielectric layer 12 formed over an electrically conducting member or layer 14. The electrically conducting member 14 may take the form of a doped silicon substrate or it may be a first or subsequent conducting layer formed on a substrate. The dielectric layer 12 will have been previously patterned to form part of an electronic device. A dielectric layer 12 is formed over the conducting member 14 in accordance with procedures known in the art to form a part of an overall integrated circuit.

The dielectric layer 12 is then etched to form interconnecting apertures 16 between conducting layers. The patterning and etching of the apertures 16 may be accomplished with any conventional method known to one of ordinary skill in the art. The aperture 16 has walls 18 formed in the dielectric layer 12 that extend downward a sufficient distance to expose a surface or floor 20 of the conducting member or layer 14.

Figure 5:
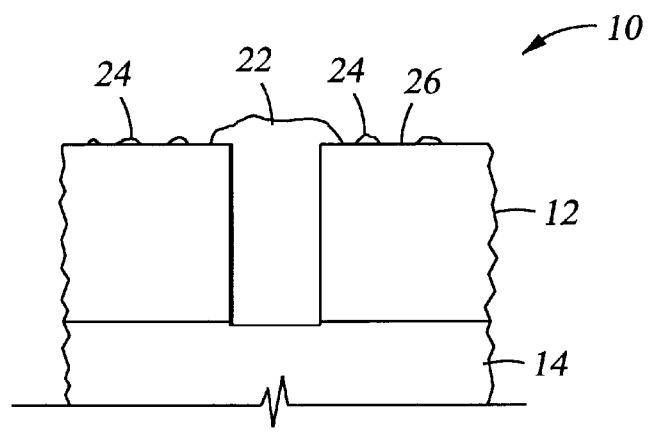
FIG. 5 is a cross-sectional view of a void-free metal interconnect formed by selective chemical vapor deposition and nodules formed on the substrate field by loss of selectivity.

Referring to FIG. 5, a cross-sectional view of a void-free metal interconnect 22 is shown formed in the layered structure 10. Selective chemical vapor deposition of a metal provides contact or via fill without forming voids therein. However, nodules 24 of conducting metal will form due to unintended loss of selectivity at the site of defects on the dielectric surface 26.

While a CVD metal, such as CVD aluminum, may be selectively deposited under various conditions, a typical process involves substrate temperatures of between about 150° C. and about 300° C. and a deposition rate of between about 20 Å/sec and about 2000 Å/sec. The CVD metal deposition may be performed at any chamber pressure, with the preferred chamber pressures being between about 0.5 torr and about 80 torr. The preferred CVD metal is CVD aluminum ("CVD Al"), and the preferred deposition reaction for CVD Al involves the decomposition of dimethyl aluminum hydride ("DMAH") either with or without hydrogen gas ($H_2$).

Deposition within the aperture 16 (See FIG. 4) to form metal interconnect 22 is selective because the surface 20 of the underlying conductive layer 14 which has been exposed to the CVD Al at the floor of the aperture 16 provides electrons that initiate the decomposition reaction. Therefore, the CVD Al is deposited from the floor 20 upward to fill the aperture 16 without substantial CVD Al deposition on the via or contact walls 18 (See FIG. 4).

After an initial layer of the metal has been deposited on the aperture floor 20, subsequent deposition occurs more easily so that the metal grows from the aperture floor upward to fill the hole 16.

Although defects on the dielectric wall 18 of the aperture 16 may cause the formation of scattered nodules within the aperture, these nodules will usually not block the aperture to cause voids therein. Because the conducting aperture floor exposes a large surface area of a nucleation material relative to the dielectric defects on the walls, the aperture will be filled with metal from the floor upward before a nodule has an opportunity to grow across the aperture and form a void therein.

Figure 6:
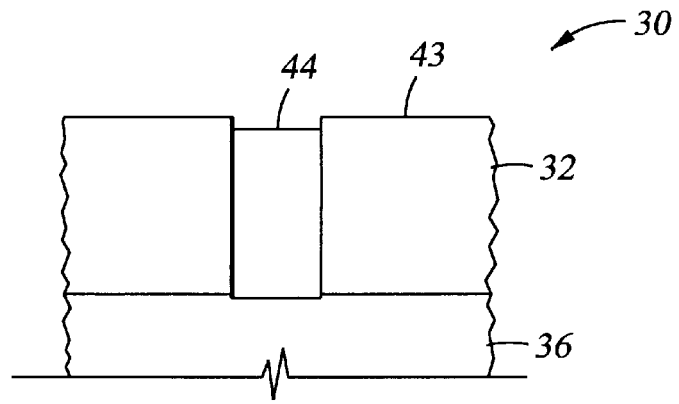
FIG. 6 is a cross-sectional view of the substrate of FIG. 2 having a planarized metal film formed thereon by warm physical vapor deposition.

Now referring to FIG. 6, the layered structure 10 is shown having been moved to a PVD Al chamber for deposition of a PVD Al layer 30 over the field 26 containing previously formed conducting metal deposits or nodules 24 (See FIG. 5). Although the metal deposits or nodules have been described herein as being formed by the loss of selectivity during a selective deposition process, the present process is believed to be equally effective at forming planarizing metal films over rough metal deposits caused by any process. Where the conducting metal deposits or nodules 24 are aluminum, it is preferred that the PVD metal layer 30 be comprised of aluminum deposited at a substrate temperature greater than about 150° C., more preferably at a substrate temperature greater than about 250° C., and most preferably at a substrate temperature greater than about 300° C. The aluminum layer 30 that is deposited will exhibit grain growth to absorb the nodules 24 and/or flow around the nodules at temperatures above roughly 250° C.

It is preferred that the PVD Al layer 30 include at least trace amounts of copper (Cu). This can be accomplished by using an AlCu target to form a PVD AlCu layer. When the PVD Al layer sequentially follows selective CVD Al in an integrated process having a PVD and CVD chamber on the same cluster tool, an oxide layer caused by exposure of the wafer to air will not appreciably form. Furthermore, the sequential CVD Al/PVD Al process, where the PVD Al contains Cu, allows the intermixed layer to be annealed to achieve substantially uniform distribution of Cu in the CVD/PVD layers. It is preferred that the intermixed layer be annealed at a substrate temperature of between about 250° C. and about 350° C. It is also preferred that the top surface 32 of the intermixed CVD/PVD Al layer receive a PVD TiN anti-reflection coating ("ARC") (not shown) for reducing the reflectivity of the surface and improving the photolithographic performance of the layer. Finally, a most preferred method of the present invention for metallization of a substrate aperture includes the sequential steps of covering a conducting member 14 with a dielectric layer 12, etching apertures 16 to expose a portion of the conducting member 14, depositing selective CVD Al in apertures 16, depositing a warm PVD Al layer 30 over the dielectric field 26 containing nodules 24, and depositing a TiN ARC layer (not shown).

Figure 1:
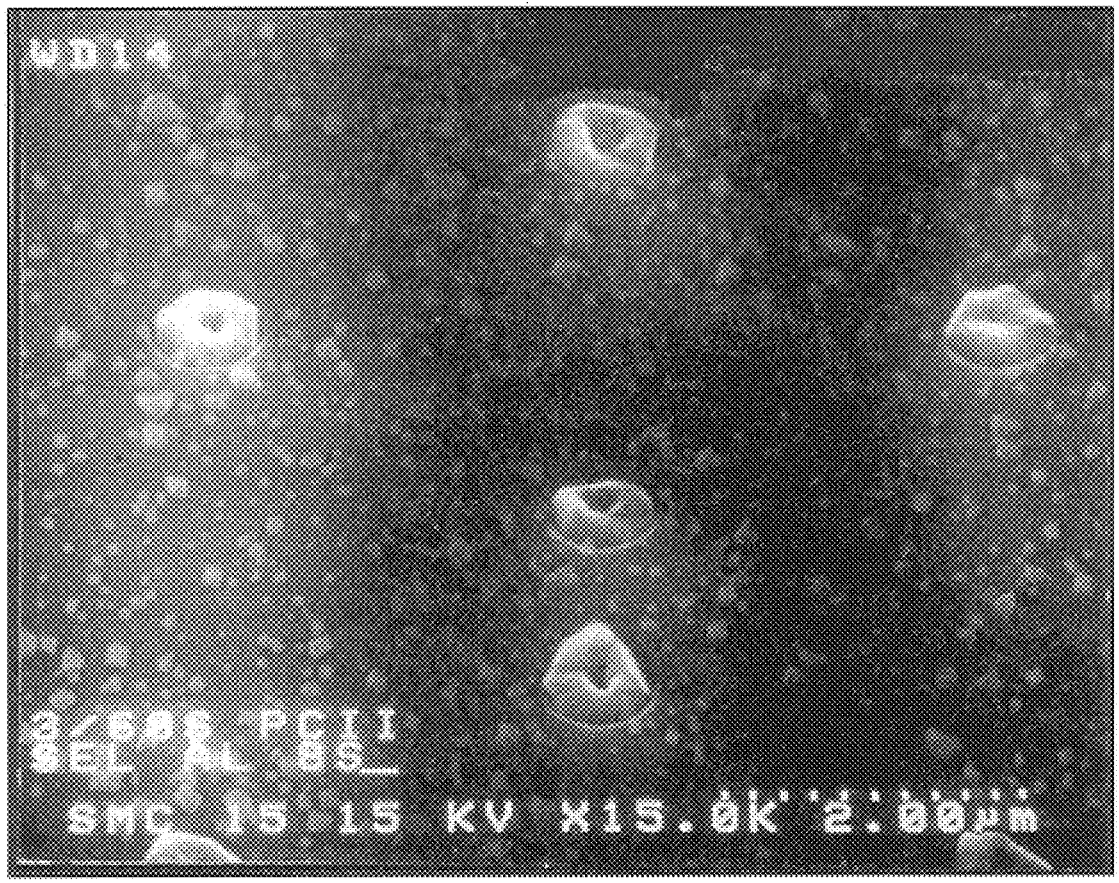
FIG. 1 is a scanning electron micrograph ("SEM") showing a top angle view of a patterned wafer which has been precleaned and subsequently deposited with a selective CVD Al process.
Figure 2:
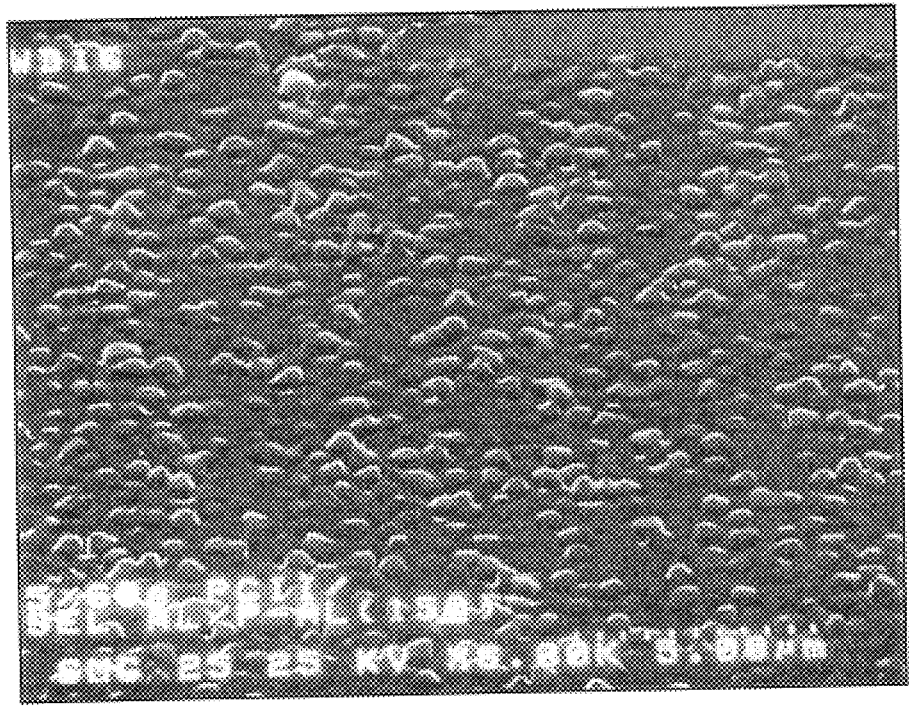
FIG. 2 is a top angle view of the patterned substrate of FIG. 1 which has been subsequently deposited with approximately 6000 Angstroms of PVD Al at 150° C.
Figure 3:
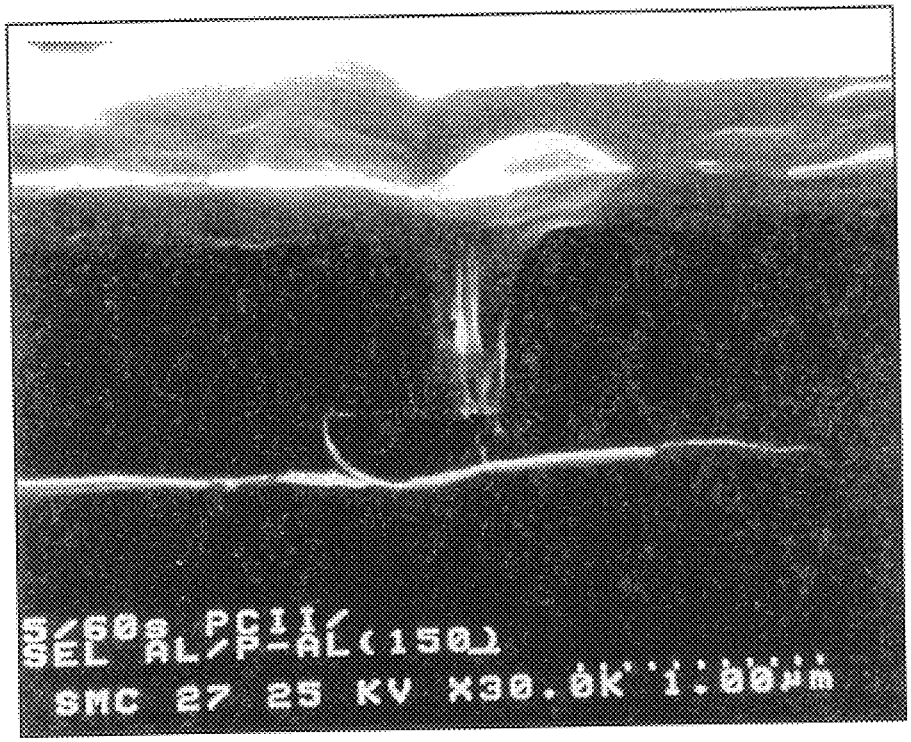
FIG. 3 is a cross-sectional view of the substrate of FIG. 2.
Figure 7:
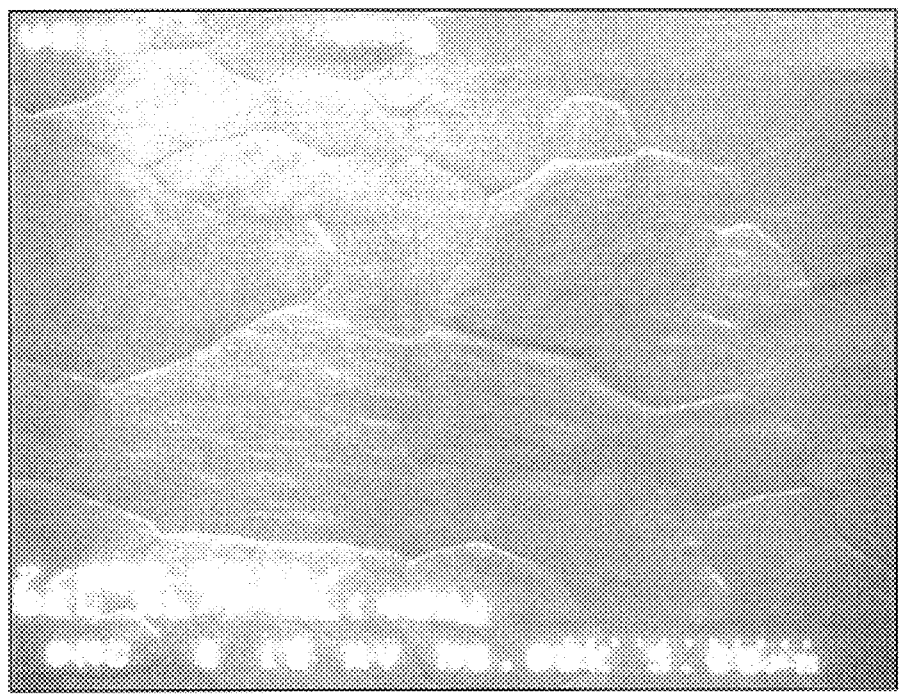
FIG. 7 is a top angle view of a planarized metal film of the present invention formed on the substrate of FIG. 1 by PVD Al at a temperature of 400° C.
Figure 8:
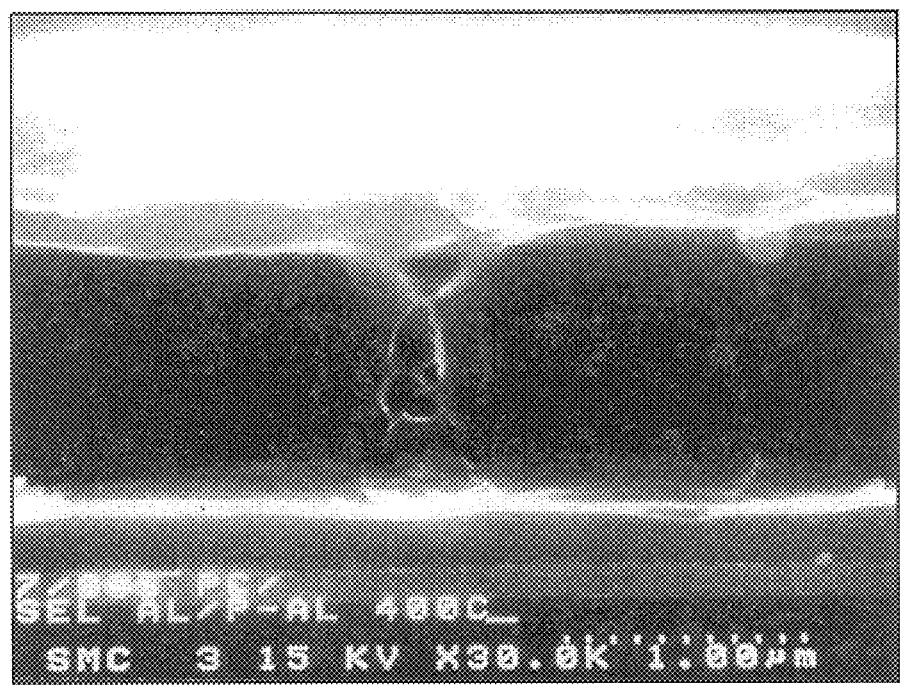
FIG. 8 is a cross-sectional view of the substrate of FIG. 7.

Referring now to FIGS. 7 and 8, a top angle view and a cross-sectional view are shown, respectively, of a planarized metal film of the present invention formed on the substrate of FIG. 1 by PVD Al at a temperature of 400° C. The top surface of the metal film of FIG. 7 is substantially planar (compared with FIG. 2 for PVD Al at 150° C.) and will provide better lithographic performance. FIG. 8 in conjunction with FIG. 7 illustrate that the crystal grains are much larger than the PVD metal film of FIGS. 2 and 3. The larger grains mean fewer grain boundaries that can lead to circuit failure.

Figure 9:
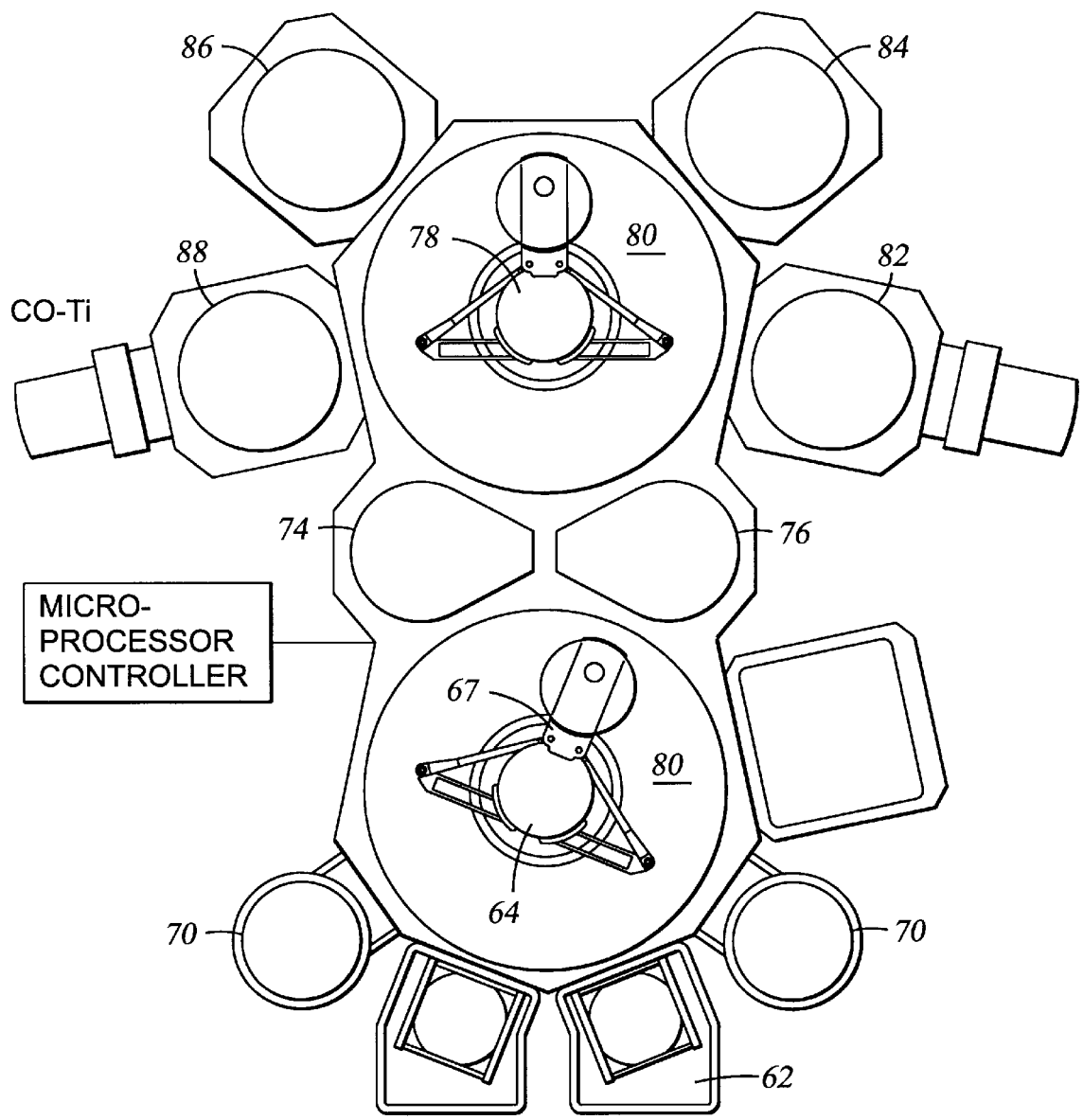
FIG. 9 is an integrated processing system configured for sequential metallization in accordance with the present invention.

Referring now to FIG. 9, a schematic diagram of an integrated cluster tool 60 is shown. Typically, substrates are introduced and withdrawn from the cluster tool 60 through a cassette loadlock 62. A robot 64 having a blade 67 is located within the cluster tool 60 to move the substrates through the cluster tool 60. One robot 64 is typically positioned in a buffer chamber 68 to transfer substrates between the cassette loadlock 62, degas wafer orientation chamber 70, preclean chamber 74, PVD TiN chamber 72 and cooldown chamber 76. A second robot 78 is located in transfer chamber 80 to transfer substrates to and from the cooldown chamber 76, preclean chamber 74, CVD Al chamber 84 and PVD AlCu processing chamber 88. The transfer chamber 80 in the integrated system is preferably maintained at low/high pressure vacuum in the range of $10^{-3}$ to $10^{-8}$ torr. The specific configuration of the chambers in FIG. 9 comprises an integrated processing system capable of both CVD and PVD processes in a single cluster tool. The chamber configuration is merely illustrative and should not be taken as limiting the application of the present invention.

Typically, a substrate processed in the cluster tool 60 is passed from the cassette loadlock 62 to the buffer chamber 68 where the robot 64 first moves the substrate into a degas chamber 70. The substrate may then be transferred into preclean chamber 74, a CVD Al chamber 84, a PVD Al/Cu chamber 88, and, optionally, a PVD TiN anti-reflection coating ("ARC"). The substrate is then moved to the cooldown chamber 76. The substrate is removed from the cluster tool 60, following processing, through the buffer chamber 68 and then to the loadlock 62. A microprocessor controller 80 is provided to control the sequence and formation of the desired film layers on the substrates.

Where the PVD Al layer contains Cu (PVD Al/Cu), the Cu may be diffused into the selectively filled aperture, because the integrated system allows the substrate to be processed continually in a single processing tool having both a CVD Al chamber and a PVD Al chamber. This prevents exposure of the processed substrate to the outside environment which may result in the formation of oxide layers on the exposed surface, i.e., the selective CVD Al formed in the apertures. Oxide layers allowed to form on the CVD Al layers will inhibit even distribution of the Cu provided by the PVD Al layer throughout the CVD Al.

One staged-vacuum wafer processing system is disclosed in U.S. Pat. No. 5,186,718, entitled "Staged-Vacuum Wafer Processing System and Method," Tepman et al., issued on Feb. 16, 1993, which is hereby incorporated herein by reference.

Figure 10:
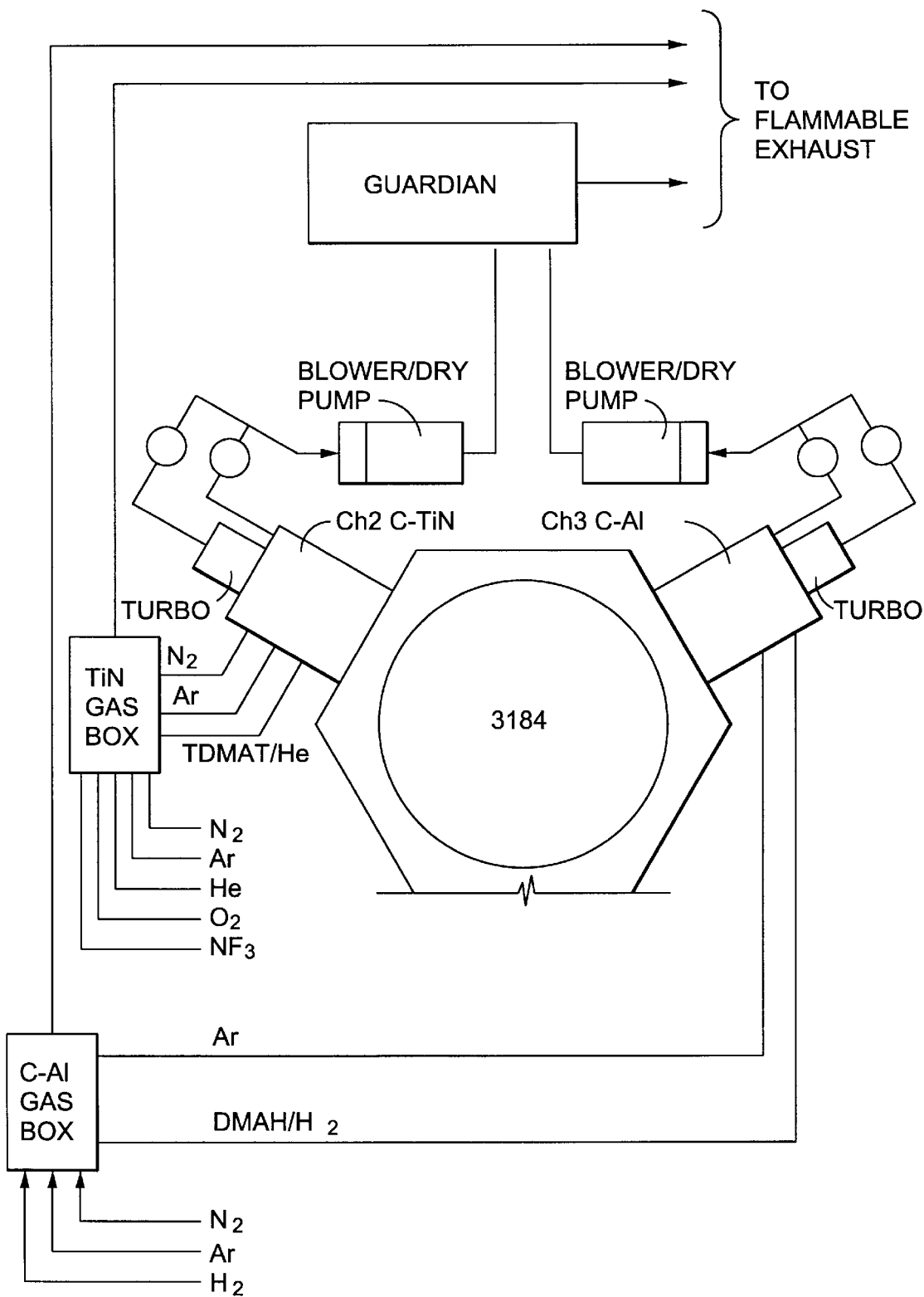
FIG. 10 is a schematic flow diagram of a gas box delivery system for supplying gases to the system of FIG. 9.

Referring now to FIG. 10, a gas box system for supplying gases to the CVD chamber of the system in FIG. 9 is illustrated. A CVD Al gas box is typically supplied with DMAH, Ar and $H_2$. The CVD Al precursor, dimethyl aluminum hydride ("DMAH") is passed into the CVD Al chamber for deposition of aluminum. The DMAH may be used alone or in combination with $H_2$ or an inert gas such as argon (Ar). The CVD chamber is equipped with a turbo pump for providing a vacuum in the chamber and a blower/dry pump. The PVD chamber typically requires only a flow of argon.

While the foregoing is directed to the preferred embodiment of the present invention, other and further embodiments of the invention may be devised without departing from the basic scope thereof. The scope of the invention is determined by the claims which follow.

I claim:

1. A method of forming a planarized blanket metal film, comprising the steps of:
   a) selectively depositing a metal to substantially fill one or more apertures in a substrate surface and through a loss of selectivity during said depositing forming nonuniform metal deposits on an uppermost exposed surface of said substrate, said uppermost exposed surface excluding sidewall and bottom surfaces within said one or more apertures; and
   b) physical vapor depositing a metal layer at a substrate temperature greater than about 150° C., over the apertures substantially filled with said metal and the uppermost exposed surface of said substrate having the nonuniform metal deposits formed thereon.

2. The method of claim 1, wherein the physical vapor deposited metal layer and the non-uniform metal deposits are the same metal.

3. The method of claim 1, wherein the non-uniform metal deposits are chemical vapor deposited aluminum.

4. The method of claim 1, wherein the non-uniform metal deposits are formed on the uppermost exposed surface of the substrate due to a loss of selectivity during selective chemical vapor deposition of said metal within said one or more substrate apertures.

5. The method of claim 1, wherein the physical vapor deposition is performed at a substrate temperature greater than about 250° C.

6. The method of claim 1, wherein the physical vapor deposition is performed at a substrate temperature greater than about 300° C.

7. The method of claim 6, wherein the physical vapor deposition is performed at a substrate temperature of about 400° C.

8. The method of claim 1, wherein the physical vapor deposited metal layer comprises aluminum and a dopant, the method further comprising the step of:
   (c) annealing the physical vapor deposited metal layer at a temperature of between about 250° C. and about 350° C.

9. The method of claim 8, wherein the dopant is copper.

10. In a process for forming metal interconnects on a substrate having one or more apertures formed therein, wherein, through a loss of selectivity, nonuniform metal deposits are formed during selective deposition of a metal in said one or more apertures on an uppermost exposed surface of said substrate excluding sidewall and bottom surfaces of said one or more apertures, an improvement comprising the step of:
    a) physical vapor depositing a metal, at a substrate temperature greater than about 150° C., over the uppermost exposed surface of the substrate having the nonuniform metal deposits formed thereon.

11. The process of claim 10, wherein the substrate temperature is about 400° C.

12. A method of forming a void-free metal interconnect in a substrate aperture and a planarized metal film over an uppermost exposed surface of said substrate, the method comprising the steps of:
    a) selectively chemical vapor depositing a metal on an aperture floor within the substrate aperture, wherein nonuniform metal deposits of the metal are formed on the uppermost exposed surface of said substrate excluding sidewall and bottom surfaces within said aperture due to a loss of selectivity; and
    b) physical vapor depositing a metal over the uppermost exposed surface of the substrate to provide a metal film having a substantially planar surface at a substrate temperature greater than about 150° C.

13. The process of claim 12, wherein the physical vapor deposition substrate temperature is about 400° C.

14. The method of claim 12, wherein the step of selectively chemical vapor depositing a metal comprises the steps of:
    (c) providing dimethyl aluminum hydride;
    (d) decomposing the dimethyl aluminum hydride on aperture floor, wherein the aperture floor is comprised of an electrically conducting material.

15. The method of claim 12, wherein the substrate aperture comprises a subhalf micron, high aspect ratio via or interconnect.

* * * * *

UNITED STATES PATENT AND TRADEMARK OFFICE
CERTIFICATE OF CORRECTION

PATENT NO  : 5,989,633

DATED      : November 23, 1999

INVENTOR(S): Mark Hoinkis

It is certified that error appears in the above-identified patent and that said Letters Patent are hereby corrected as shown below:

In column 3, line 41, before " So" , please insert " The file of this patent includes at least one drawing executed in color. Copies of this patent with color drawings will be provided by the Patent and Trademark Office upon request and payment of necessary fee."

In column 3, line 52, please replace " scanning electron micrograph (" SEM" )" , with " color drawing prepared from data obtained with a scanning electron microscope" .

Signed and Sealed this

Ninth Day of May, 2000

Attest:

Q. TODD DICKINSON

Attesting Officer

Director of Patents and Trademarks